US006927164B2

(12) United States Patent
Biwa et al.

(10) Patent No.: US 6,927,164 B2
(45) Date of Patent: Aug. 9, 2005

(54) METHOD OF FABRICATING SEMICONDUCTOR DEVICE AND SEMICONDUCTOR DEVICE

(75) Inventors: Goshi Biwa, Kanagawa (JP); Hiroyuki Okuyama, Kanagawa (JP); Masato Doi, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 342 days.

(21) Appl. No.: 10/211,419

(22) Filed: Aug. 2, 2002

(65) Prior Publication Data

US 2003/0045042 A1 Mar. 6, 2003

(30) Foreign Application Priority Data

Aug. 3, 2001 (JP) ...................................... P2001-237087

(51) Int. Cl.[7] .............................................. H01L 21/44
(52) U.S. Cl. ........................ 438/674; 438/748; 438/771
(58) Field of Search ................................ 438/674, 720, 438/727, 737, 748, 771, 776, 715, 716, 742, 746

(56) References Cited

U.S. PATENT DOCUMENTS 6,319,741 B1 * 11/2001 Izumi et al.

FOREIGN PATENT DOCUMENTS

| JP | 10-125929 | 5/1998 |
| JP | 2000-332343 | 11/2000 |
| JP | 2001-501778 | 6/2001 |
| WO | WO 98/14986 | 4/1998 |

OTHER PUBLICATIONS

Kapolnek et al, "Spatial control of InGaN luminescence by MOCVD selective epitaxy", pp. 83–86.

* cited by examiner

Primary Examiner—Phuc T. Dang
(74) Attorney, Agent, or Firm—Bell, Boyd & Lloyd LLC

(57) ABSTRACT

A first conductive type layer having a band gap energy smaller than that of an under growth layer formed on a substrate is formed by selective growth from an opening portion formed in the under growth layer, and an active layer and a second conductive type layer are stacked on the first conductive type layer, to form a stacked structure. When such a stacked structure for forming a semiconductor device is irradiated with laser beams having an energy value between the band gap energies of the under growth layer and the first conductive type layer, abrasion occurs at a first conductive type layer side interface between the under growth layer and the first conductive type layer, so that the stacked structure is peeled from the substrate and the under growth layer and simultaneously isolated from another stacked structure for forming another semiconductor device. Since the first conductive layer has good crystallinity and is suitable for formation of an electrode thereon, an electrode can be efficiently formed on the back surface of the first conductive type layer of the peeled stacked structure.

28 Claims, 16 Drawing Sheets

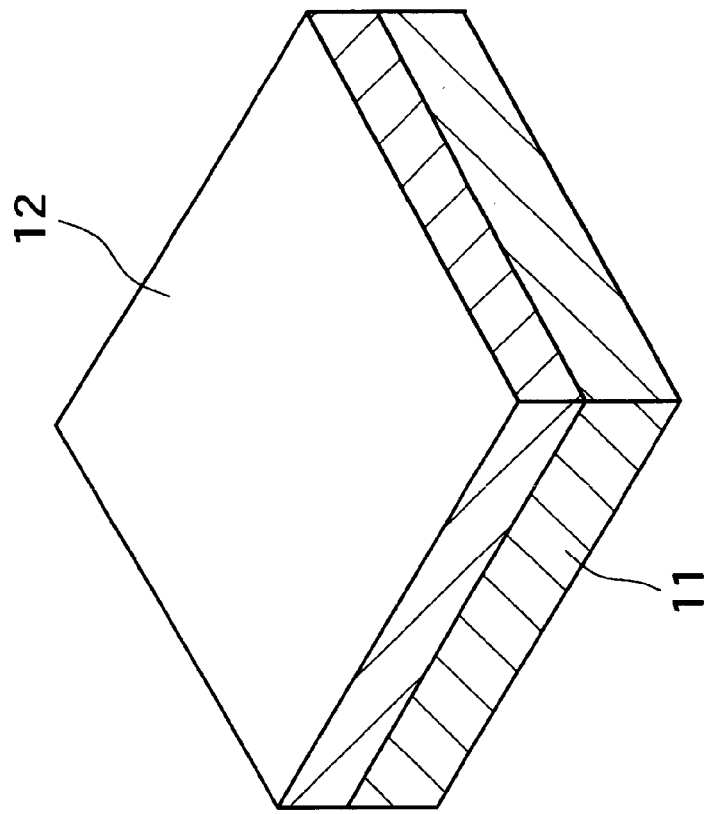
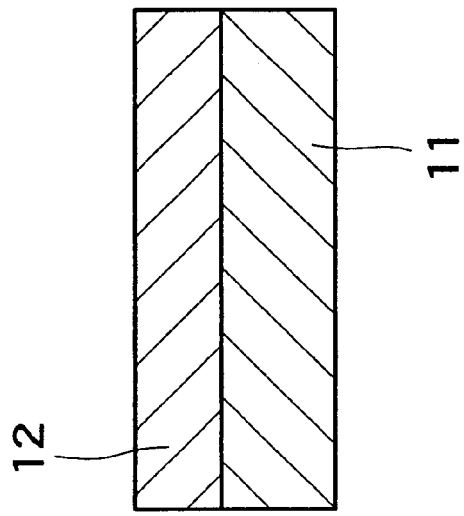
FIG. 1B
FIG. 1A

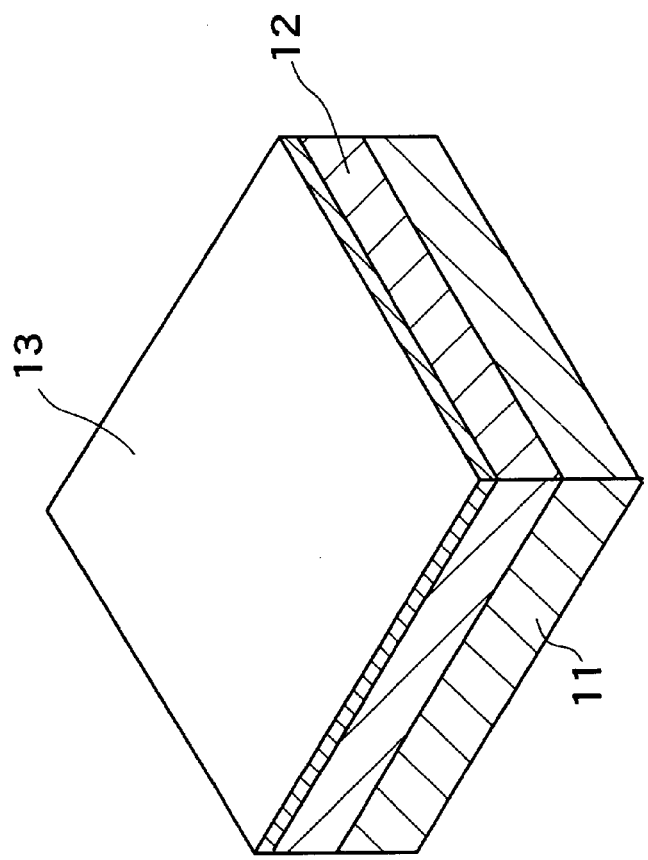
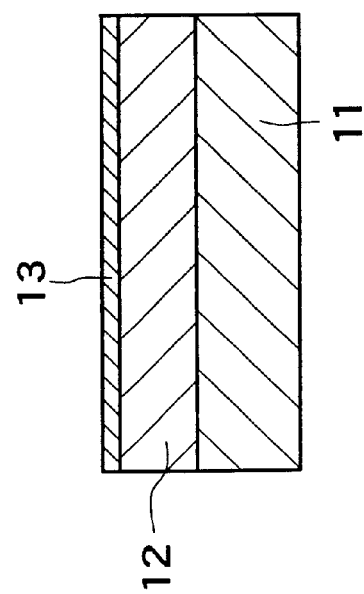

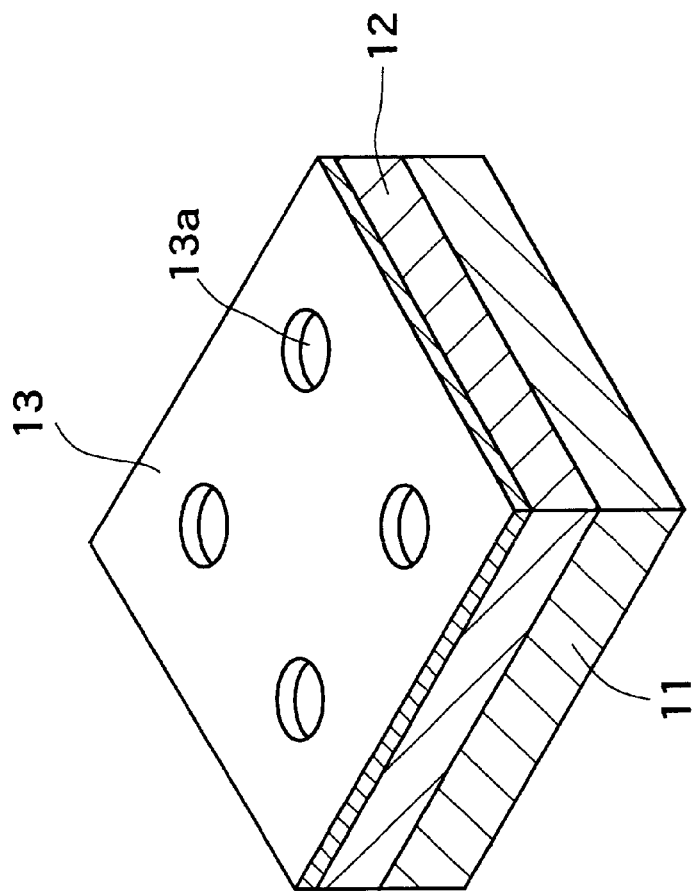

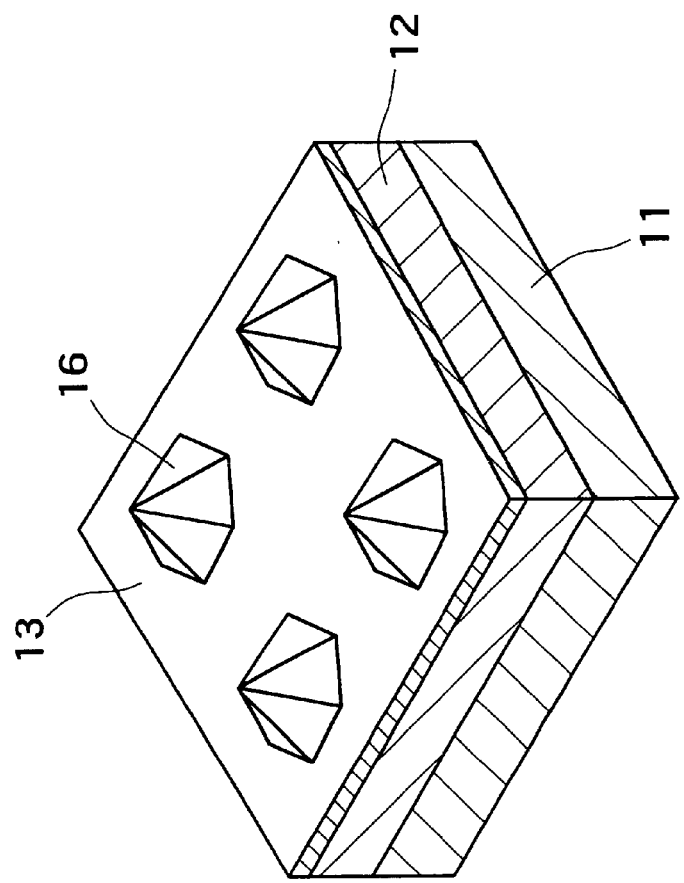
F I G. 5B
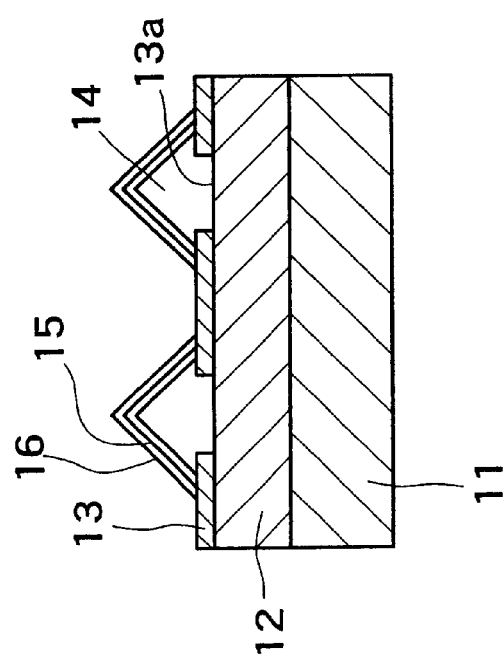
F I G. 5A

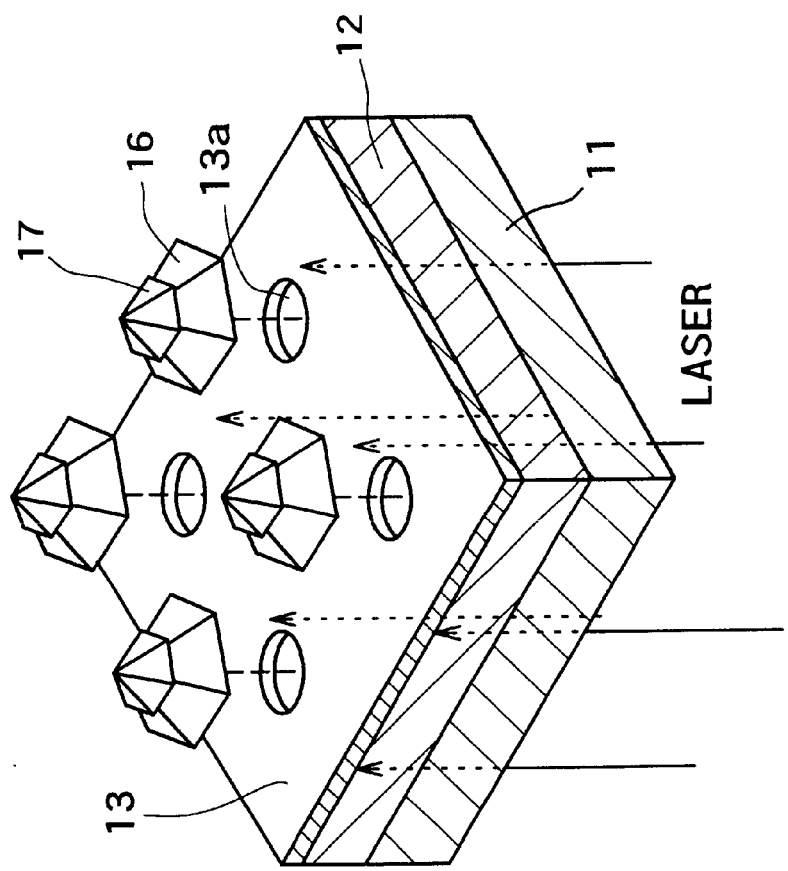
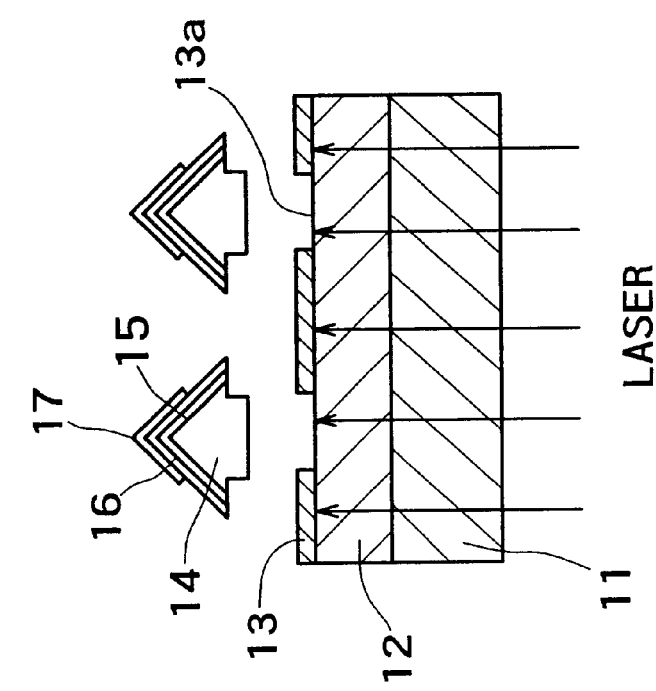

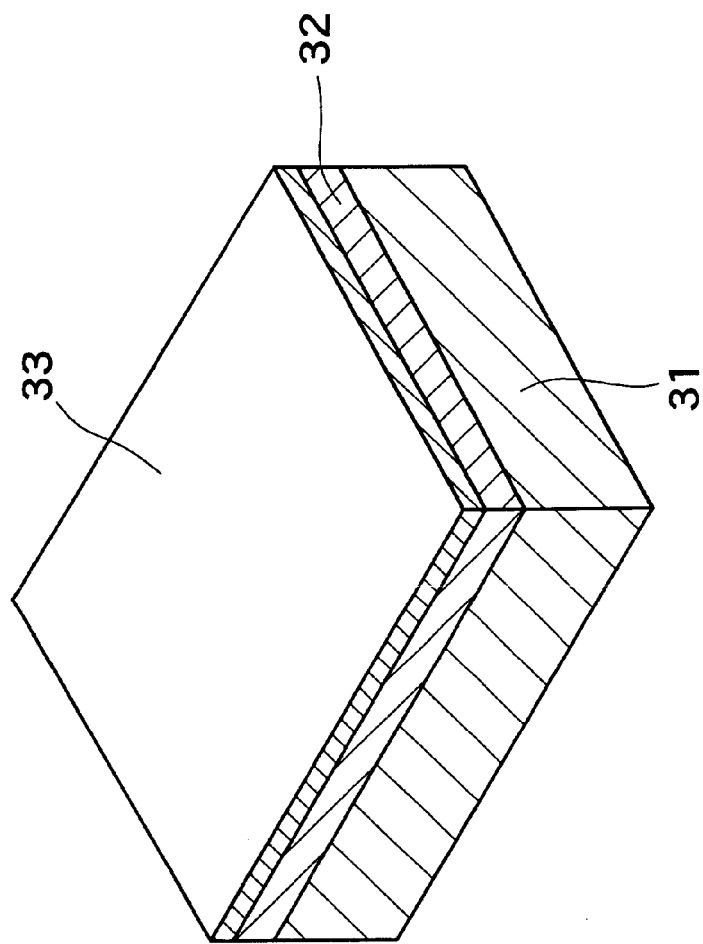
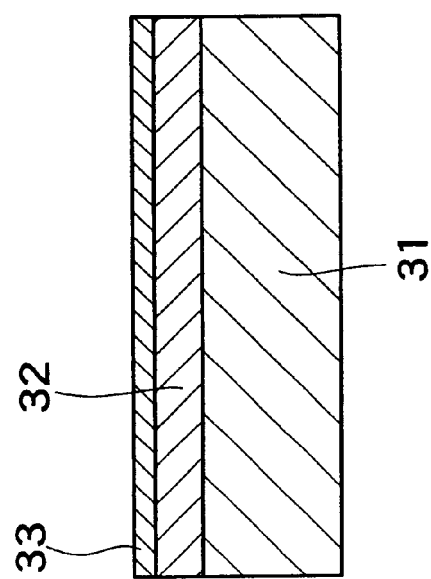
FIG.9B
FIG.9A

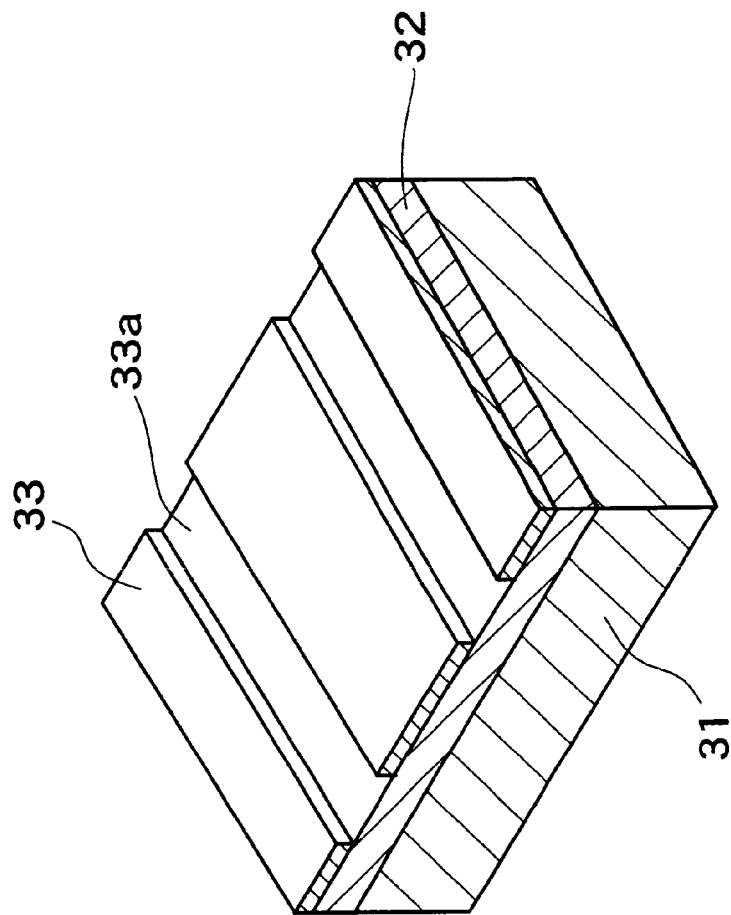
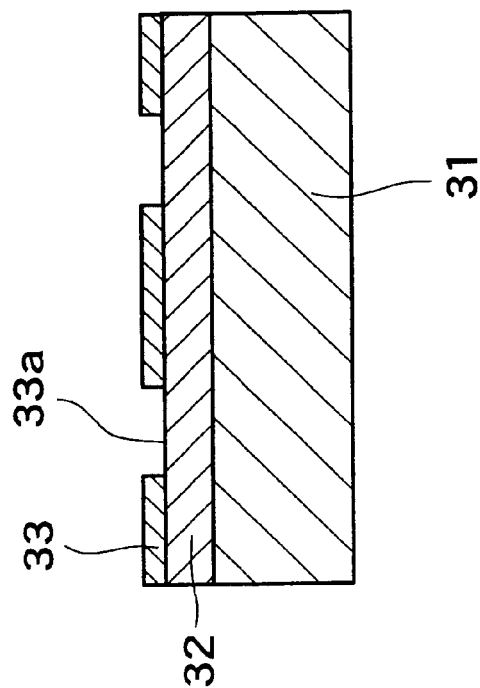
FIG.10A
FIG.10B

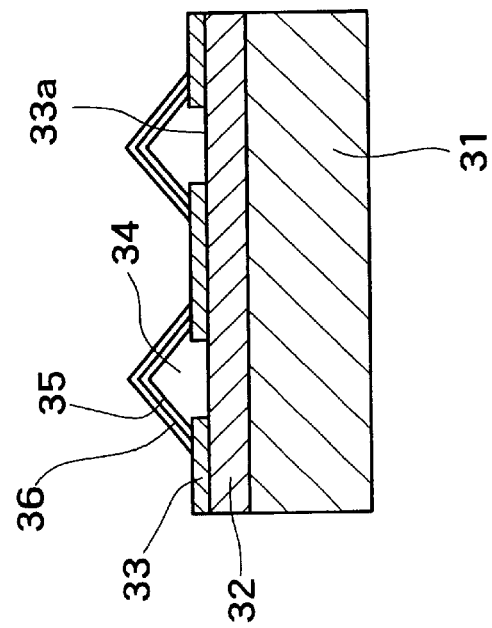
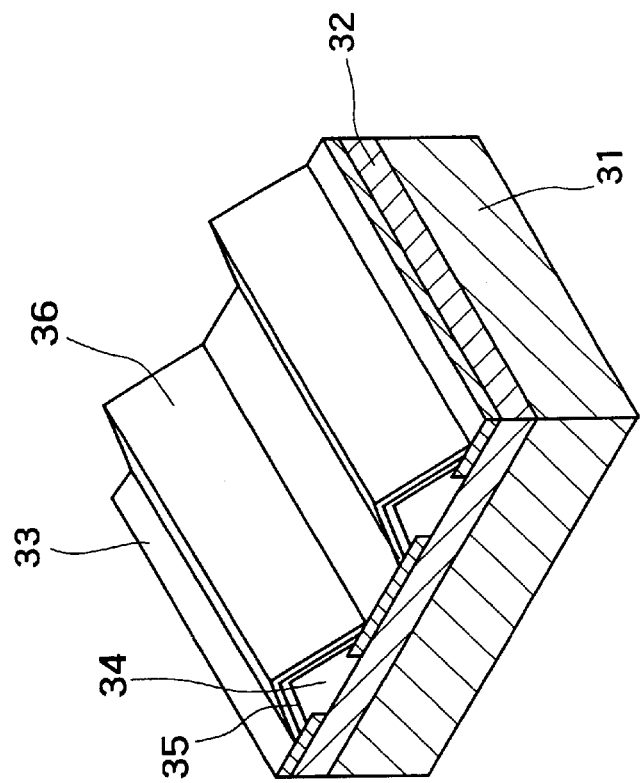
FIG.12A
FIG.12B

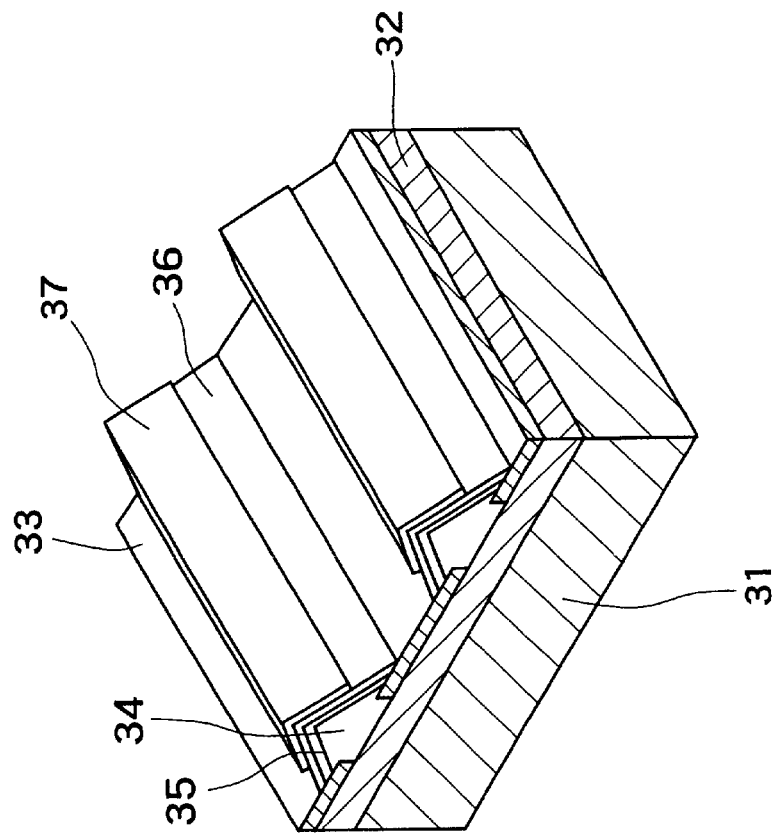
F I G. 1 3 B
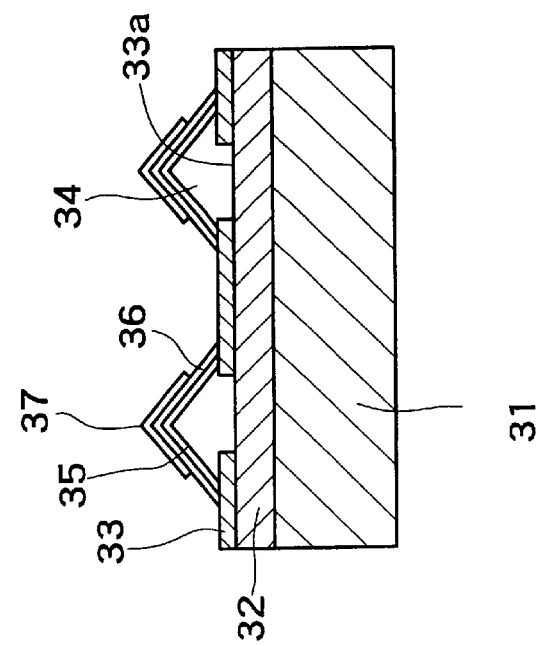
F I G. 1 3 A

LASER

METHOD OF FABRICATING SEMICONDUCTOR DEVICE AND SEMICONDUCTOR DEVICE

BACKGROUND OF THE INVENTION

The present invention relates to a method of fabricating a semiconductor device and a semiconductor device fabricated by the fabrication method, and particularly to a method of fabricating a semiconductor device using nitride based compound semiconductors, which is capable of peeling an under growth layer together with a growth substrate and efficiently forming an electrode on the back surface of a first conductive type layer, and a semiconductor device fabricated by the fabrication method.

A technique of peeling semiconductor growth layers stacked on a sapphire substrate from the sapphire substrate by etching has been known. The peeling technique using etching, however, has a problem associated with a slow etching rate and damage of a crystal plane by etching.

In particular, since it is difficult to peel nitride based compound semiconductor growth layers from a sapphire substrate by wet etching, the nitride based compound semiconductor growth layers have been peeled from the sapphire substrate by dry etching such as reactive ion etching. In this case, however, since a corrosive gas is used for reactive ion etching, a crystal plane is generally damaged by the corrosive gas.

To cope with such problems caused in peeling semiconductor growth layers from a growth substrate by etching, there has been developed a method of peeling semiconductor growth layers from a growth substrate by irradiating the semiconductor growth layers with laser beams traveling from the back side of the growth substrate, to cause abrasion at the interface between the semiconductor growth layers and the growth substrate, thereby peeling the semiconductor growth layers from the growth substrate.

In the case of nitride based compound semiconductor growth layers, when the semiconductor growth layers stacked on a sapphire substrate are irradiated with laser beams traveling from the back side of the sapphire substrate, an undoped layer and a buffer layer of the semiconductor growth layers absorb the laser beams, to cause abrasion, whereby the semiconductor growth layers are peeled, together with the undoped layer and the buffer layer, from the sapphire substrate. The undoped layer and buffer layer are then etched and an electrode is formed on the back surface of a semiconductor device portion of the peeled semiconductor growth layers.

Such a peeling method using laser abrasion, however, has problems that since the undoped layer and the buffer layer on the back surface of the semiconductor growth layers peeled from the sapphire substrate have a polycrystalline or amorphous structure having a high resistance, it is not appropriate to form an electrode on the undoped layer and the buffer layer, and since the undoped layer and the buffer layer are etched, the fabrication efficiency is degraded.

In the case of forming an electrode on the back surface of a semiconductor device portion of semiconductor growth layers, if the back surface of the semiconductor growth layers is etched, the number of steps of fabricating a semiconductor device is increased, to increase the fabrication cost of the semiconductor device, thereby increasing the fabrication cost of an image display unit using the semiconductor devices.

For nitride based compound semiconductor growth layers, to form an electrode on the back surface of a device portion of the semiconductor growth layers, the back surface of the device portion cannot be etched by wet etching. Therefore, it is etched by dry etching such as reactive ion etching, with a result that an undoped layer and a buffer layer on which the electrode is to be formed are significantly damaged by a corrosive gas used for dry etching.

SUMMARY OF THE INVENTION

An object of the present invention is to provide a method of fabricating a semiconductor device, which is capable of peeling an under growth layer together with a growth substrate, and efficiently forming an electrode on the back surface of a first conductive type layer, and to provide a semiconductor device fabricated by the fabrication method.

To achieve the above object, according to a first embodiment of the present invention, there is provided a method of fabricating a semiconductor device, including the steps of: forming an under growth layer on a substrate; forming an anti-growth film having a specific opening portion on the under growth layer; forming a first conductive type layer by selective growth from the opening portion, the first conductive type layer having band gap energy smaller than that of the under growth layer; stacking an active layer and a second conductive type layer on the first conductive type layer, to form a stacked structure; and peeling the stacked structure from the substrate and the under growth layer at an interface between the under growth layer and the first conductive type layer by irradiating the stacked structure with light rays traveling through the substrate.

According to a second embodiment of the present invention, there is provided a semiconductor device including: an under growth layer formed on a substrate; an anti-growth film, having a specific opening portion, formed on the under growth layer; a first conductive type layer formed by selective growth from the opening portion, the first conductive type layer having band gap energy smaller than that of the under growth layer; and an active layer and a second conductive type layer stacked on the first conductive type layer, to form a stacked structure; wherein the stacked structure is peeled from the substrate and the under growth layer at an interface between the under growth layer and the first conductive type layer by irradiating the stacked structure with light rays traveling through the substrate.

The method of fabricating a semiconductor device and the semiconductor device fabricated by the fabrication method according to the present invention have the following advantages:

In general, semiconductor growth layers formed on a growth substrate are peeled from the growth substrate due to abrasion caused by irradiating the semiconductor growth layers with laser beams traveling from the back side of the growth substrate. With this laser abrasion, according to the above-described configuration of the first embodiment of the present invention, since the first conductive type layer of the stacked structure has band gap energy smaller than that of the under growth layer and laser beams emitted to the back side of the growth substrate for irradiation of the stacked structure have an energy value between the band gap energies of the under growth layer and the first conductive type layer, abrasion occurs at a first conductive type layer side interface between the under growth layer and the first conductive type layer. Accordingly, the stacked structure can be peeled at the interface between the under growth layer and the first conductive type layer. In other words, the under growth layer and a buffer layer can be simply peeled, together with the growth substrate from the stacked structure. An electrode can be efficiently formed on the back surface of the first conductive type layer of the stacked structure thus simply peeled. As a result, it is possible to reduce the fabrication cost of a semiconductor device.

At the time of peeling the stacked structure of the semiconductor growth layers from the growth substrate, the under growth layer and the buffer layer can be peeled from the stacked structure, the surface of the first conductive layer, on which an electrode is to be formed, can be treated not by dry etching such as reactive ion etching liable to cause large damage of crystal but by wet etching performed, for example, using acid with less damage of crystal. As a result, an electrode can be formed on the first conductive type layer, which has good crystallinity, with less damage of crystal.

According to the present invention, in the case of peeling the stacked structure composed of the first conductive type layer, the active layer, and the second conductive type layer from the substrate due to abrasion caused by irradiating the stacked structure with laser beams traveling from the back side of the substrate, the stacked structure can be simultaneously peeled from the under growth layer and the buffer layer having a high resistance polycrystalline or amorphous structure, so that an electrode can be efficiently formed on the back surface of the first conductive type layer that has good crystallinity and thereby suitable for forming an electrode thereon. Since the electrode can be efficiently formed, the fabrication cost of a semiconductor device can be reduced, with a result that the fabrication cost of an image display unit on which the semiconductor devices are mounted can be reduced.

Each of the stacked structures composed of the first conductive layer, the active layer, and the second conductive layer formed by selective growth is bonded to the growth substrate via the under growth layer; however, the stacked structures are separated from each other. As a result, when peeled from the growth substrate and the under growth layer, the stacked structures can be simultaneously isolated from each other. A number of the stacked structures, each containing a number of semiconductor devices, can be thus efficiently peeled from the growth substrate and the under growth layer and simultaneously isolated from each other.

In the case of peeling the stacked structure composed of the first conductive type layer, the active layer, and the second conductive type layer due to abrasion caused by laser irradiation, it is possible to peel a desired device portion of the stacked structure from the growth substrate and the under growth layer by selectively irradiating the desired device portion with laser beams or forming a mask for selectively collecting or shielding the laser beams.

The growth substrate and the under growth layer, from which the stacked structure has been peeled, can be reused by etching the surfaces thereof with acid. In the case of fabricating a semiconductor device using nitride based compound semiconductors having a large lattice mismatching with a growth substrate, it takes a large cost to fabricate the growth substrate provided with the under growth layer on which semiconductor growth layers are to be formed. In this regard, by reusing the growth substrate and the under growth layer, it is possible to reduce the fabrication cost.

Unlike a related art semiconductor device in which only a growth substrate is peeled or a middle portion of a under growth layer is peeled, according to the semiconductor device of the present invention, since the under growth layer is peeled together with the growth substrate, it is possible to reduce the size of the semiconductor device as compared with the related art semiconductor device. In the case of mounting the devices of the present invention, if each of the devices is covered with a resin for easy handling, since the electrode is formed on the back surface of the device, it is possible to carry out various forms of wiring to the device.

Additional features and advantages of the present invention are described in, and will be apparent from, the following Detailed Description of the Invention and the Figures.

BRIEF DESCRIPTION OF THE FIGURES

FIGS. 1A and 1B are a sectional view and a perspective view, respectively, showing the step of forming an under growth layer in a method of fabricating a semiconductor device according to a first embodiment of the present invention.

FIGS. 2A and 2B are a sectional view and a perspective view, respectively, showing the step of forming an anti-growth film in the method of fabricating a semiconductor device according to the first embodiment of the present invention.

FIGS. 3A and 3B are a sectional view and a perspective view, respectively, showing the step of forming an opening portion in the method of fabricating a semiconductor device according to the first embodiment of the present invention.

FIGS. 5A and 5B are a sectional view and a perspective view, respectively, showing the step of forming an active layer and a second conductive type layer in the method of fabricating a semiconductor device according to the first embodiment of the present invention.

FIGS. 7A and 7B are a sectional view and a perspective view, respectively, showing the step of peeling the growth substrate and the under growth layer in the method of fabricating a semiconductor device according to the first embodiment of the present invention.

FIGS. 9A and 9B are a sectional view and a perspective view, respectively, showing the step of forming an under growth layer and an anti-growth layer in a method of fabricating a semiconductor device according to a second embodiment of the present invention.

FIGS. 10A and 10B are a sectional view and a perspective view, respectively, showing the step of forming an opening portion in the method of fabricating a semiconductor device according to the second embodiment of the present invention.

FIGS. 12A and 12B are a sectional view and a perspective view, respectively, showing the step of forming an active layer and a second conductive type layer in the method of fabricating a semiconductor device according to the second embodiment of the present invention.

FIGS. 13A and 13B are a sectional view and a perspective view, respectively, showing the step of forming a p-side electrode in the method of fabricating a semiconductor device according to the second embodiment of the present invention.

DETAILED DESCRIPTION OF THE INVENTION

First Embodiment

Figure 4A:
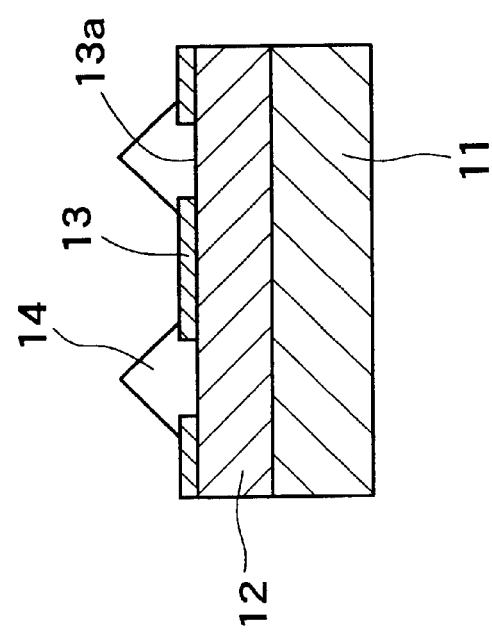
FIGS. 4A and 4B are a sectional view and a perspective view, respectively, showing the step of forming a first conductive type layer in the method of fabricating a semiconductor device according to the first embodiment of the present invention.

A first embodiment will be described with reference to FIGS. 1A to 8B. In this embodiment, the present invention is applied to a method of fabricating a semiconductor light emitting device of a hexagonal pyramid shape having an approximately triangular cross-section by selective crystal growth.

FIGS. 1A and 1B are a sectional view and a perspective view, respectively, showing a step of forming an under growth layer in the fabrication method according to the first embodiment.

An under growth layer 12 is formed on a growth substrate 11. Any substrate may be used as the growth substrate 11 insofar as a wurtzite type compound semiconductor layer is formable thereon. For example, a sapphire substrate with a C-plane of sapphire taken as a principal plane of the substrate, which has been often adopted for growth of gallium nitride (GaN) based compound semiconductors, may be used as the growth substrate 11. It is to be noted that the C-plane of sapphire taken as a principal plane of the substrate is not limited to a strict C-plane but may be tilted therefrom in a range of 5° to 6°. In particular, according to the first embodiment, since stacked structures formed on the growth substrate 11 via the under growth layer 12 are to be irradiated with laser beams traveling from the back side of the growth substrate 11 at the time of peeling the growth substrate 11 and the under growth layer 12 from the stacked structures in the subsequent step, the growth substrate 11 is preferably configured as a light permeable substrate such as a sapphire substrate.

The under growth layer 12 formed on the principal plane of the growth substrate 11 may be made from a wurtzite type compound semiconductor. This is because a wurtzite type compound semiconductor layer having a hexagonal pyramid structure is to be formed on the under growth layer 12 in the subsequent step. For example, the under growth layer 12 may be made from a group III based compound semiconductor; specifically, a gallium nitride (GaN) based compound semiconductor, aluminum nitride (AlN) based compound semiconductor, indium nitride (InN) based compound semiconductor, indium gallium nitride (InGaN) based compound semiconductor, or aluminum gallium nitride (AlGaN) based compound semiconductor.

The under growth layer 12 may be grown by any known vapor phase growth process; for example, metal organic chemical vapor deposition (MOCVD) (which is also called a metal organic vapor phase epitaxial growth (MOVPE) process), a molecular beam epitaxial growth (MBE) process, or a hydride vapor phase epitaxial growth (HVPE) process. In particular, the MOVPE process is advantageous in growing the under growth layer with good crystallinity at a high processing rate. While not shown in FIGS. 1A and 1B, a specific buffer layer may be formed on the bottom side of the under growth layer 12.

An impurity such as silicon is generally doped in the entire under growth layer 12 because the under growth layer 12 functions as a conductive layer on which an n-side electrode is to be formed. According to the first embodiment, however, it is not required to dope any impurity in the under growth layer 12. The reason for this is that, as will be described later, at the time of peeling the growth substrate 11 from stacked structures by abrasion caused by irradiating the stacked structures with laser beams traveling from the back side of the growth substrate 11, the under growth layer 12 is to be peeled together with the growth substrate 11. That is to say, it is not required to dope any impurity in the under growth layer 12 to be peeled together with the growth substrate 11.

FIGS. 2A and 2B are a sectional view and a perspective view, respectively, showing the step of forming an anti-growth film in the fabrication method according to the first embodiment.

An anti-growth film 13 made from silicon oxide or silicon nitride is formed as a mask layer on the overall surface of the under growth layer 12 by a sputtering process or the like.

FIGS. 3A and 3B are a sectional view and a perspective view, respectively, showing the step of forming opening portions in the fabrication method according to the first embodiment.

Opening portions 13a are formed in the anti-growth film 13 functioning as the mask layer. In general, the shape of each opening portion 13a used for selective growth is not particularly limited insofar as a facet structure having a tilt plane tilted from the principal plane of the growth substrate 11 can be formed by selective growth from the opening portion 13a. For example, the opening portion 13a may be formed into a stripe shape, a rectangular shape, a circular shape, an elliptic shape, a triangular shape, or a polygonal shape such as a hexagonal shape. The surface of the under growth layer 12, located under the anti-growth film 13, is exposed from the opening portions 13a. According to the first embodiment, since a stacked structure composed of a first conductive layer, an active layer, and a second conductive type layer is to be formed into a hexagonal pyramid shape having an approximately triangular cross-section by selective growth from the opening portion 13a, the opening portion 13a may be formed into a circular shape or a hexagonal shape. The opening portion 13a shown in FIGS. 3A and 3B is formed into a circular shape.

Figure 4B:
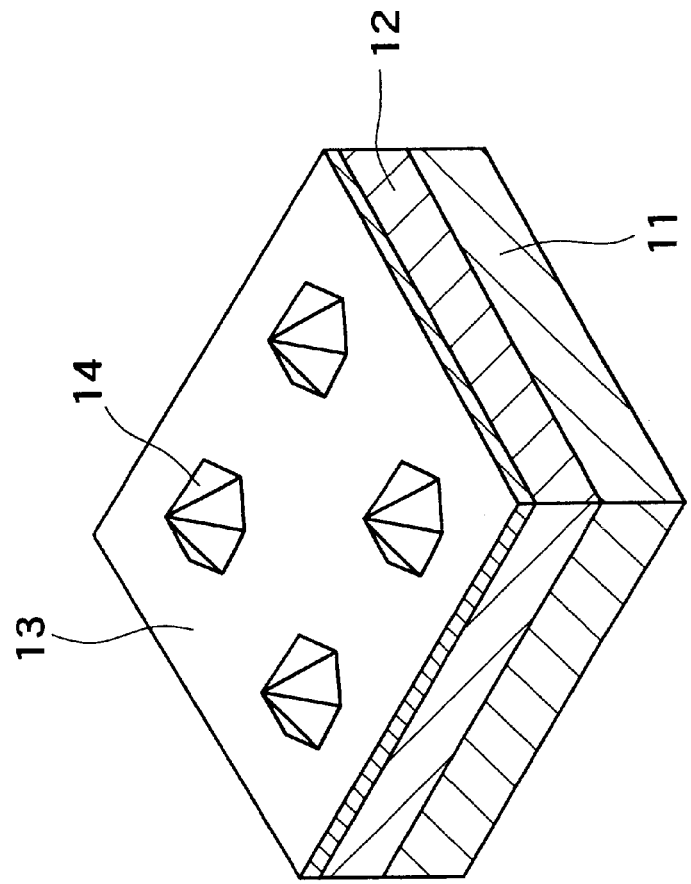

FIGS. 4A and 4B are a sectional view and a perspective view, respectively, showing the step of forming a first conductive type layer in the fabrication method according to the first embodiment.

A first conductive type layer 14 is formed by selective growth from each of the opening portions 13a having the circular shape. Like the under growth layer 12, the first conductive type layer 14 is made from a wurtzite type compound semiconductor such as GaN doped with silicon. The first conductive type layer 14 functions as an n-type cladding layer. If a sapphire substrate with the C-plane of sapphire taken as a principal plane of the substrate is used as the growth substrate 11, the first conductive type layer 14 is formed into a hexagonal pyramid shape having an approximately triangular cross-section by selective growth as shown in FIG. 4B.

According to the first embodiment, band gap energy of a semiconductor material forming the first conductive type layer 14 is required to be smaller than that of a semiconductor material forming the under growth layer 12. To meet such a requirement, for example, the under growth layer 12 may be made from AlGaN and the first conductive layer 14 may be made from GaN.

FIGS. 5A and 5B are a sectional view and a perspective view, respectively, showing the step of forming an active layer and a second conductive type layer in the fabrication method according to the first embodiment.

An active layer 15 and a second conductive type layer 16 are stacked in this order on the first conductive type layer 14.

The active layer 15 functions as a light emission layer of a semiconductor light emitting device, and is configured as an InGaN layer or as an InGaN sandwiched between AlGaN layers. The active layer 15 extends along the facet composed of the tilt planes of the first conductive type layer 14. The thickness of the active layer 15 is set to a value that is suitable for light emission. The active layer 15 may be configured as a single bulk active layer but may be configured as a layer having a quantum well structure such as a single quantum well (SQW) structure, a double quantum well (DQW) structure, or a multiple quantum well (MQW) structure. If the active layer 15 is configured as a layer having the multiple quantum well structure, a barrier layer may be used for separating quantum wells from each other as needed.

The second conductive type layer 16 is made from a wurtzite type compound semiconductor such as GaN doped with magnesium. The second conductive type layer 16 functions as a p-type cladding layer. The second conductive type layer 16 also extends along the facet composed of the tilt planes of the first conductive type layer 14. The tilt plane of the hexagonal pyramid shape formed by selective growth may be selected from an S-plane, a (11–22) plane, and planes substantially equivalent thereto.

Figure 6A:
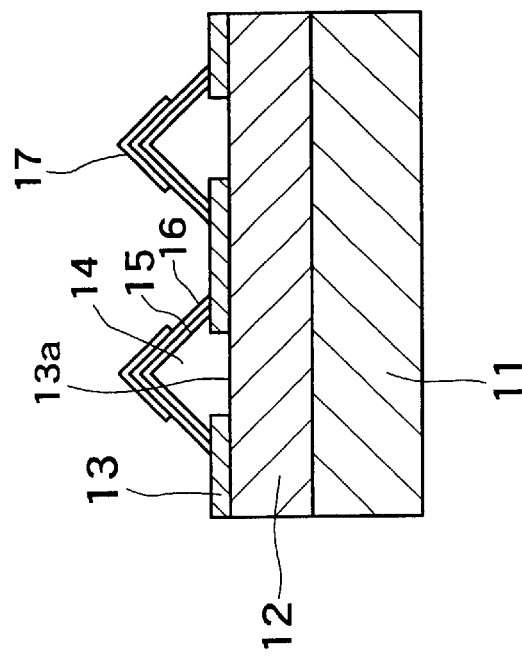
FIGS. 6A and 6B are a sectional view and a perspective view, respectively, showing the step of forming a p-side electrode in the method of fabricating a semiconductor device according to the first embodiment of the present invention.
Figure 6B:
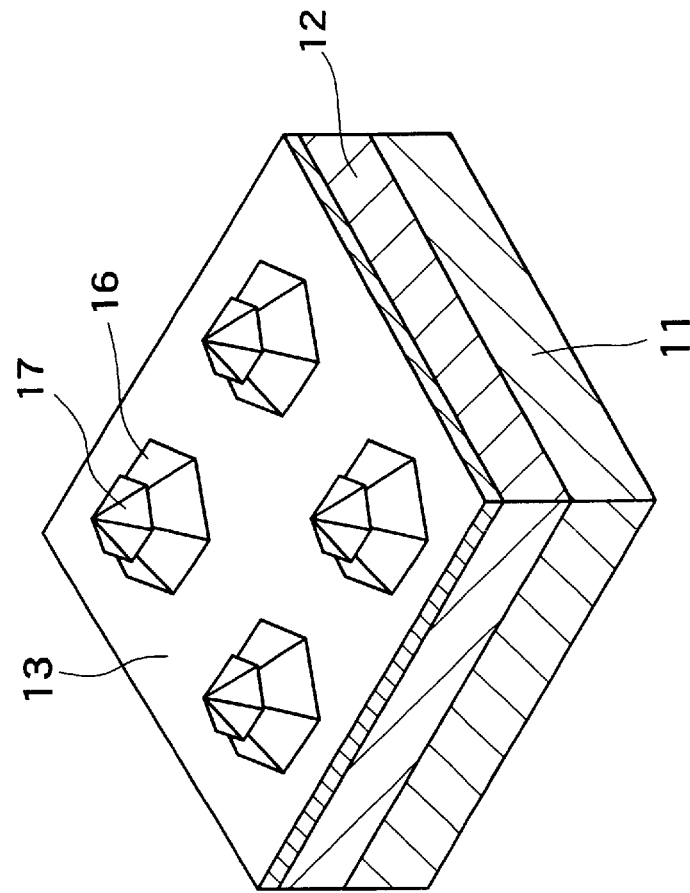

FIGS. 6A and 6B are a sectional view and a perspective view, respectively, showing the step of forming a p-side electrode in the fabrication method according to the first embodiment.

A p-side electrode 17 is formed on the surface of the second conductive type layer 16, which is the outermost layer of the hexagonal pyramid shaped stacked structure composed of the first conductive type layer 14, the active layer 15, and the second conductive type layer 16. For example, the p-side electrode 17 has a stacked metal structure of Ni/Pt/Au or Pd/Pt/Au formed by a vapor-deposition process. It is to be noted that an n-side electrode is formed on the back surface of the hexagonal pyramid shaped stacked structure and, therefore, it is not formed in this step.

FIGS. 7A and 7B are a sectional view and a perspective view, showing the step of peeling the growth substrate 11 and the under growth layer 12 from the hexagonal pyramid shaped stacked structures by irradiating the hexagonal pyramid shaped stacked structures with laser beams traveling from the back side of the growth substrate in the fabrication method according to the first embodiment, respectively.

Laser beams such as excimer laser beams as ultraviolet laser beams or YAG laser beams may be emitted to the overall back surface of the growth substrate or regions, corresponding to target semiconductor light emitting devices, of the back surface of the growth substrate 11.

Since the band gap energy of the first conductive layer 14 is, as described above, smaller than that of the under growth layer 12, if laser beams having an energy value between these band gap energies is used as the laser beams emitted to the back side of the growth substrate 11, the laser beams are not absorbed by the under growth layer 12 but are absorbed by the first conductive type layer 14. Accordingly, since a first conductive type layer 14 side interface between the under growth layer 12 and the first conductive type layer 14 absorbs the laser beams, abrasion occurs at the first conductive type layer 14 side interface, with a result that the growth substrate 11 is peeled, together with the under growth layer 12, from the hexagonal pyramid shaped stacked structures.

In the case where the under growth layer 12 is made from AlGan (Al content: about 15%) and the first conductive type layer 14 (doped with silicon) is made from GaN having band gap energy smaller than that of AlGaN, if third harmonic YAG laser beams (355 nm) are emitted to the back side of the growth substrate 11, the first conductive type layer 14 side interface between the under growth layer 12 and the first conductive type layer 14 absorbs the YAG laser beams, so that GaN is decomposed into gallium (Ga) and nitrogen at the first conductive type layer 14 side interface, with the result that the growth substrate 11 and the under growth layer 12 are easily peeled from the hexagonal pyramid shaped stacked structures.

The band gap energy of AlGaN (Al content: about 15%) forming the under growth layer 12 is 3.8 eV, the band gap energy of GaN forming the first conductive type layer 14 is 3.2 eV, and the energy of the third harmonic YAG laser beams (355 nm) is 3.5 eV. Accordingly, the YAG laser beams are not absorbed by the under growth layer 12 but absorbed by the first conductive layer 14, with a result that abrasion occurs at the first conductive layer 14 side interface.

As described above, when the hexagonal pyramid shaped stacked structure including the first conductive layer 14 made from a semiconductor material having band gap energy smaller than that of the under growth layer 12 is irradiated with laser beams having an energy value between the band gap energies of the two layers 12 and 14, the laser beams are not absorbed by the under growth layer 12 but absorbed by the first conductive type layer 14. Accordingly, the first conductive type layer 14 side interface between the under growth layer 12 and the first conductive type layer 14 absorbs the laser beams, and thereby abrasion occurs at the first conductive type layer 14 side interface, with a result that the growth substrate 11 and the under growth layer 12 are easily peeled from the hexagonal pyramid shaped stacked structure.

Each of the hexagonal pyramid shaped stacked structures, which is composed of the first conductive layer 14, the active layer 15, and the second conductive layer 16 formed by selective growth, is bonded to the growth substrate 11 via the under growth layer 12. However, these hexagonal pyramid shaped stacked structures are separated from each other. Accordingly, when peeled from the growth substrate 11 and the under growth layer 12, the hexagonal pyramid shaped stacked structures are simultaneously isolated from each other.

As a result, a number of hexagonal pyramid shaped stacked structures corresponding to individual semiconductor light emitting devices can be efficiently peeled from the growth substrate 11 and the under growth layer 12 and simultaneously isolated from each other.

Figure 8A:
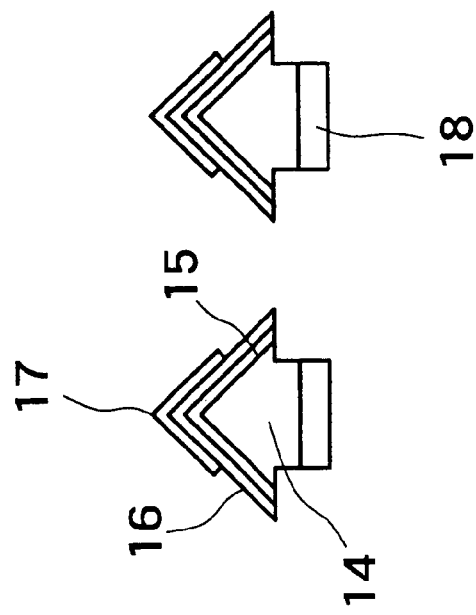
FIGS. 8A and 8B are a sectional view and a perspective view, respectively, showing the step of forming an n-side electrode in the method of fabricating a semiconductor device according to the first embodiment of the present invention.
Figure 8B:
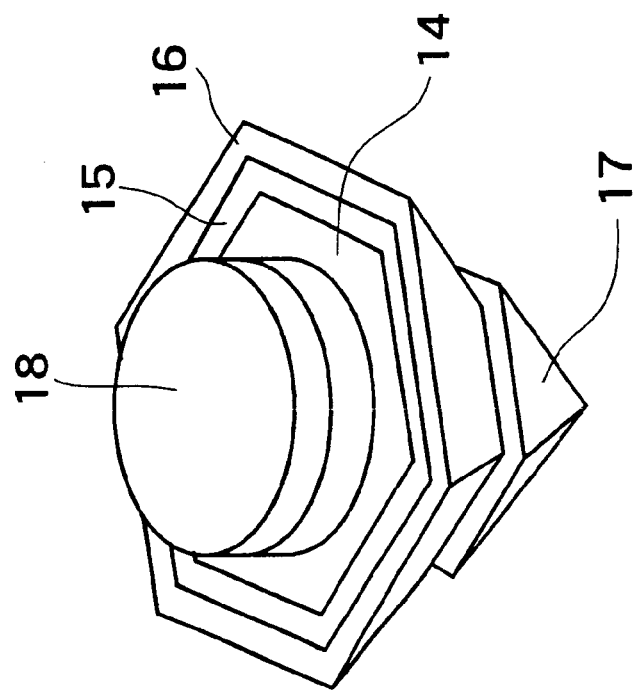

FIGS. 8A and 8B are a sectional view and a perspective view, respectively, showing the step of an n-side electrode in the fabrication method according to the first embodiment.

The back surface of each hexagonal pyramid shaped stacked structure (corresponding to a semiconductor light emitting device) is etched with acid or the like, and an n-side electrode 18 typically having a Ti/Al/Pt/Au electrode structure is formed thereon by the vapor-deposition process or the like.

The method according to the first embodiment described above has the following advantages.

Since the band gap energy of the first conductive type layer 14 is smaller than that of the under growth layer 12, when the laser beams having an energy between the band gap energies of the layers 12 and 14 are emitted to the back side of the growth substrate 11, the laser beams are not absorbed by the under growth layer 12 but absorbed by the first conductive layer 14. Accordingly, the first conductive type layer 14 side interface between the under growth layer 12 and the first conductive type layer 14 absorbs the laser beams, and thereby abrasion occurs at the first conductive type layer 14 side interface. As a result, the growth substrate 11 can be simply peeled, together with the under growth layer 12, from the hexagonal pyramid shaped stacked structure, and the n-side electrode 18 can be efficiently formed on the exposed back surface of the first conductive type layer 14 of the peeled hexagonal pyramid shaped stacked structure.

Each of the hexagonal pyramid shaped stacked structures, which is composed of the first conductive layer 14, the active layer 15, and the second conductive layer 16 formed by selective growth, is bonded to the growth substrate 11 via the under growth layer 12. However, these hexagonal pyramid shaped stacked structures are separated from each other. Accordingly, when peeled from the growth substrate 11 and the under growth layer 12, the hexagonal pyramid shaped stacked structures are simultaneously isolated from each other.

As a result, according to the first embodiment, a number of hexagonal pyramid shaped stacked structures corresponding to individual semiconductor light emitting devices can be efficiently peeled from the growth substrate 11 and the under growth layer 12 and simultaneously isolated from each other.

Second Embodiment

A second embodiment will be described with reference to FIGS. 9A to 15B. In this embodiment, the present invention is applied to a method of fabricating a semiconductor light emitting device of a triangular prism shape having an approximately triangular cross-section by selective crystal growth.

FIGS. 9A and 9B are a sectional view and a perspective view, respectively, showing a step of forming an under growth layer and an anti-growth film in the fabrication method according to the second embodiment.

Like the first embodiment, an under growth layer 32 is formed on a growth substrate 31, and an anti-growth film 33 is formed on the under growth layer 32. While not shown in FIGS. 9A and 9B, a specific buffer layer may be formed on the bottom side of the under growth layer 32.

Any substrate may be used as the growth substrate 31 insofar as a wurtzite type compound semiconductor layer is formable thereon. Like the first embodiment, since stacked structures formed on the growth substrate 31 via the under growth layer 32 are to be irradiated with laser beams traveling from the back side of the growth substrate 31 at the time of peeling the growth substrate 31 and the under growth layer 32 from the stacked structures in the subsequent step, the growth substrate 31 is preferably configured as a light permeable substrate such as a sapphire substrate.

The under growth layer 32 may be made from a wurtzite type compound semiconductor such as a gallium nitride (GaN). This is because a wurtzite type compound semiconductor layer having a hexagonal pyramid structure is to be formed on the under growth layer 32 in the subsequent step. The under growth layer 32 may be grown by the metal organic chemical vapor deposition (MOCVD) (which is also called the metal organic vapor phase epitaxial growth (MOVPE) process). An impurity such as silicon is generally doped in the under growth layer 32 because the under growth layer 32 functions as a conductive layer on which an n-side electrode is to be formed. According to the second embodiment, however, it is not required to dope any impurity in the under growth layer 32. The reason for this is that as will be described later, at the time of peeling the growth substrate 31 from stacked structures by abrasion caused by irradiating the stacked structures with laser beams traveling from the back side of the growth substrate 31, the under growth layer 32 is to be peeled together with the growth substrate 31.

The anti-growth film 33 made from silicon oxide or silicon nitride is formed as a mask layer by the sputtering process or the like.

FIGS. 10A and 10B are a sectional view and a perspective view, respectively, showing the step of forming stripe shaped opening portions in the fabrication method according to the second embodiment.

Opening portions 33a are formed in the anti-growth film 33. In general, each of the opening portions 33a is formed into a stripe shape, a circular shape, or the like, allowing a facet structure having a tilt plane tilted from the principal plane of the growth substrate 31 to be formed by selective growth from the opening portion 33a.

In particular, according to the second embodiment, to form a triangular prism shaped stacked structure having an approximately triangular cross-section composed of a first conductive type layer, an active layer, and a second conductive type layer by selective growth from the opening portion 33a, the opening portion 33a is formed into a stripe shape.

The shape of the opening portion 33a, however, is not limited to a stripe shape but may be any other shape insofar as the shape of the opening portion 13a allows a triangular prism shaped stacked structure having an approximately triangular cross-section composed of a first conductive type layer, an active layer, and a second conductive type layer to be formed by selective growth from the opening portion 33a.

Figure 11B:
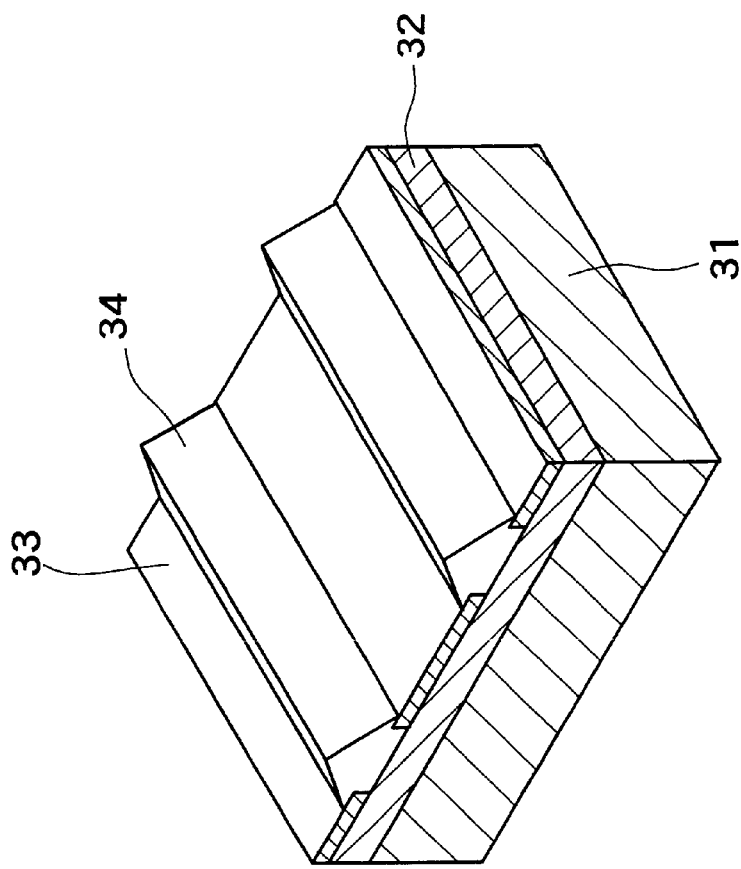
FIGS. 11A and 11B are a sectional view and a perspective view, respectively, showing the step of forming a first conductive type layer in the method of fabricating a semiconductor device according to the second embodiment of the present invention.
Figure 11A:
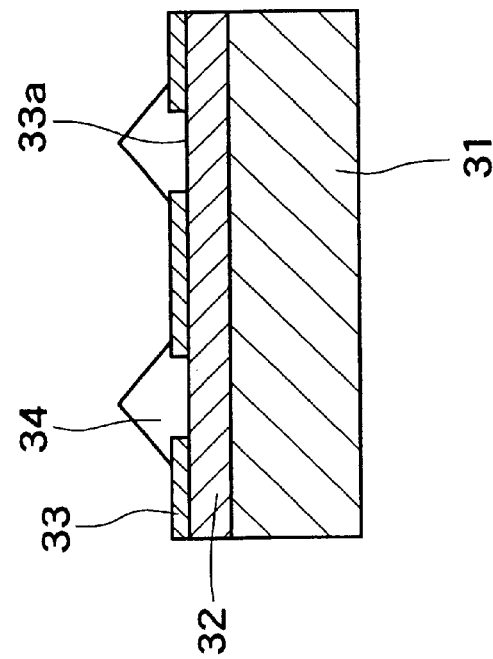

FIGS. 11A and 11B are a sectional view and a perspective view, respectively, showing the step of forming a first conductive type layer in the fabrication method according to the second embodiment.

A first conductive layer 34 is formed into a shape depending on the shape of the opening portion 33a by selective growth from the opening portion 33a. According to the second embodiment, since the opening portion 33a has a stripe shape, the first conductive type layer 34 of a triangular prism shaped stacked structure having an approximately triangular cross-section, which has a facet structure having tilted planes from the growth substrate 31, is formed by selective growth from the opening portion 33a.

The first conductive type layer 34 is made from a wurtzite type compound semiconductor such as GaN doped with silicon. The first conductive type layer 34 functions as an n-type cladding layer. According to the second embodiment, band gap energy of a semiconductor material forming the first conductive type layer 34 is required to be smaller than that of a semiconductor material forming the under growth layer 32. To meet such a requirement, for example, the under growth layer 32 may be made from AlGaN and the first conductive layer 34 may be made from GaN.

FIGS. 12A and 12B are a sectional view and a perspective view, respectively, showing an active layer and a second conductive type layer in the fabrication method according to the second embodiment.

Like the first embodiment, an active layer 35 and a second conductive type layer 36 are sequentially stacked on the first conductive type layer 34 of a triangular prism shaped structure having an approximately triangular cross-section.

The active layer 35 functions as a light emission layer of a semiconductor light emitting device, and is configured as an InGaN layer or as an InGaN sandwiched between AlGaN layers. The active layer 35 may be configured as a single bulk active layer but may be configured as a layer having a quantum well structure such as a single quantum well (SQW) structure, a double quantum well (DQW) structure, or a multiple quantum well (MQW) structure. If the active layer 35 is configured as a layer having the multiple quantum well structure, a barrier layer may be used for separating quantum wells from each other as needed.

The second conductive type layer 36 is made from a wurtzite type compound semiconductor such as GaN doped with magnesium. The second conductive type layer 36 functions as a p-type cladding layer.

FIGS. 13A and 13B are a sectional view and a perspective view, respectively, showing the step of forming a p-side electrode in the fabrication method according to the second embodiment.

A p-side electrode 37 is formed on the surface of the second conductive type layer 36, which is the outermost layer of the triangular prism shaped stacked structure composed of the first conductive type layer 34, the active layer 35, and the second conductive type layer 36. For example, the p-side electrode 37 has a stacked metal structure of Ni/Pt/Au or Pd/Pt/Au formed by the vapor-deposition process. It is to be noted that an n-side electrode is formed on the back surface of the triangular prism shaped stacked structure and, therefore, it is not formed in this step.

Figure 14B:
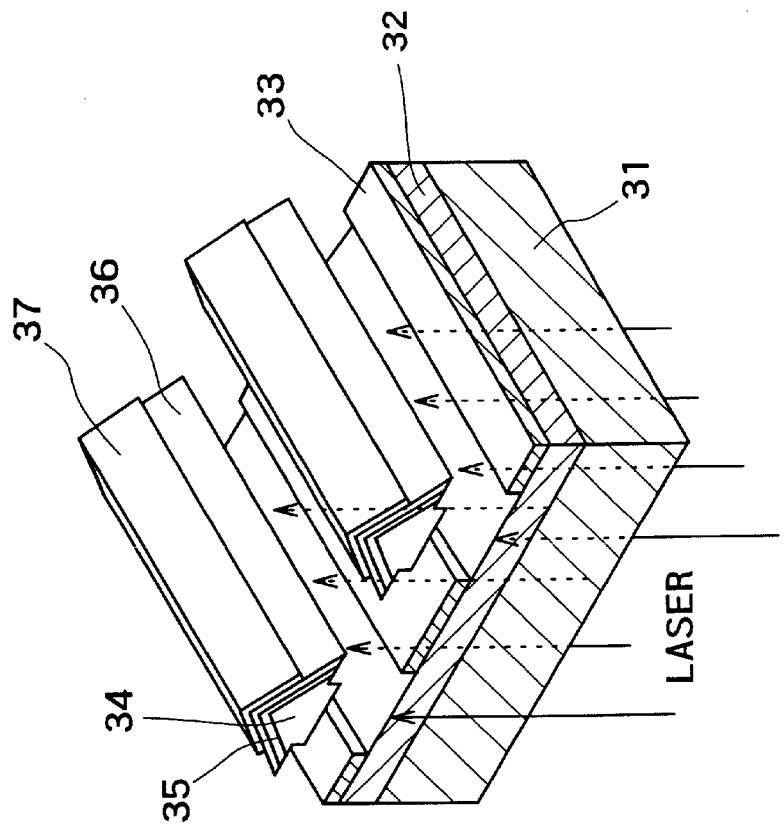
FIGS. 14A and 14B are a sectional view and a perspective view, respectively, showing the step of peeling the growth substrate and the under growth layer in the method of fabricating a semiconductor device according to the second embodiment of the present invention.
Figure 14A:
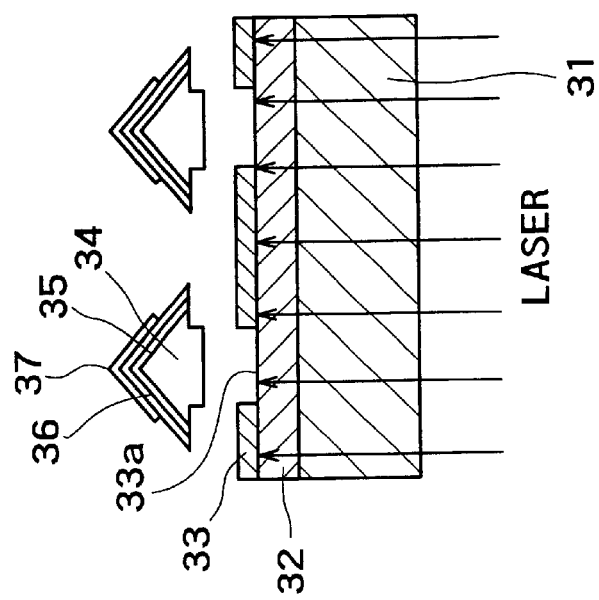

FIGS. 14A and 14B are a sectional view and a perspective view, respectively, showing the step of peeling the growth substrate and the under growth layer from the triangular prism shaped stacked structures by irradiating the triangular prism shaped stacked structures with laser beams traveling from the back side of the growth substrate in the fabrication method according to the second embodiment.

To peel the growth substrate 31 and the under growth layer 32 from the triangular prism shaped stacked structures, laser beams such as excimer laser beams as ultraviolet laser beams or higher harmonic YAG laser beams are emitted to the back side of the growth substrate 31. The laser beams may be emitted to the overall back surface of the growth substrate 31 or be selectively emitted to regions, corresponding to target semiconductor light emitting devices, of the back surface of the growth substrate 31.

Since the band gap energy of the first conductive layer 34 is, as described above, smaller than that of the under growth layer 32, if laser beams having an energy value between these band gap energies is used as the laser beams emitted to the back side of the growth substrate 31, the laser beams are not absorbed by the under growth layer 32 but are absorbed by the first conductive type layer 34. Accordingly, since a first conductive type layer 34 side interface between the under growth layer 32 and the first conductive type layer 34 absorbs the laser beams, abrasion occurs at the first conductive type layer 34 side interface, with a result that the growth substrate 31 is peeled, together with the under growth layer 32, from the triangular prism shaped stacked structures.

In the case where the under growth layer 32 is made from AlGan (Al content: about 15%) and the first conductive type layer 34 is made from GaN having band gap energy smaller than that of AlGaN, if third harmonic YAG laser beams (355 nm) are emitted to the back side of the growth substrate 31, the first conductive type layer 34 side interface between the under growth layer 32 and the first conductive type layer 34 absorbs the YAG laser beams, so that GaN is decomposed into gallium (Ga) and nitrogen at the first conductive type layer 34 side interface, with the result that the growth substrate 31 and the under growth layer 32 are easily peeled from the triangular prism shaped stacked structures.

The band gap energy of AlGaN (Al content: about 15%) forming the under growth layer 32 is 3.8 eV, the band gap energy of GaN forming the first conductive type layer 34 is 3.2 eV, and the energy of the third harmonic YAG laser beams (355 nm) is 3.5 eV. Accordingly, the YAG laser beams are not absorbed by the under growth layer 32 but absorbed by the first conductive type layer 34, with a result that abrasion occurs at the first conductive layer 34 side interface.

As described above, when the triangular prism shaped stacked structure including the first conductive layer 34 made from a semiconductor material having band gap energy smaller than that of the under growth layer 32 is irradiated with laser beams having an energy value between the band gap energies of the two layers 32 and 34, the laser beams are not absorbed by the under growth layer 32 but absorbed by the first conductive type layer 34. Accordingly, the first conductive type layer 34 side interface between the under growth layer 32 and the first conductive type layer 34 absorbs the laser beams, and thereby abrasion occurs at the first conductive type layer 34 side interface, with a result that the growth substrate 31 and the under growth layer 32 are easily peeled from the triangular prism shaped stacked structure.

Each of the triangular prism shaped stacked structures, which is composed of the first conductive layer 34, the active layer 35, and the second conductive layer 36 formed by selective growth, is bonded to the growth substrate 31 via the under growth layer 32. However, these triangular prism shaped stacked structures are separated from each other. Accordingly, when peeled from the growth substrate 31 and the under growth layer 32, the triangular prism shaped stacked structures are simultaneously isolated from each other.

As a result, a number of triangular prism shaped stacked structures, each containing a number of semiconductor light emitting devices, can be efficiently peeled from the growth substrate 31 and the under growth layer 32 and simultaneously isolated from each other.

Figure 15B:
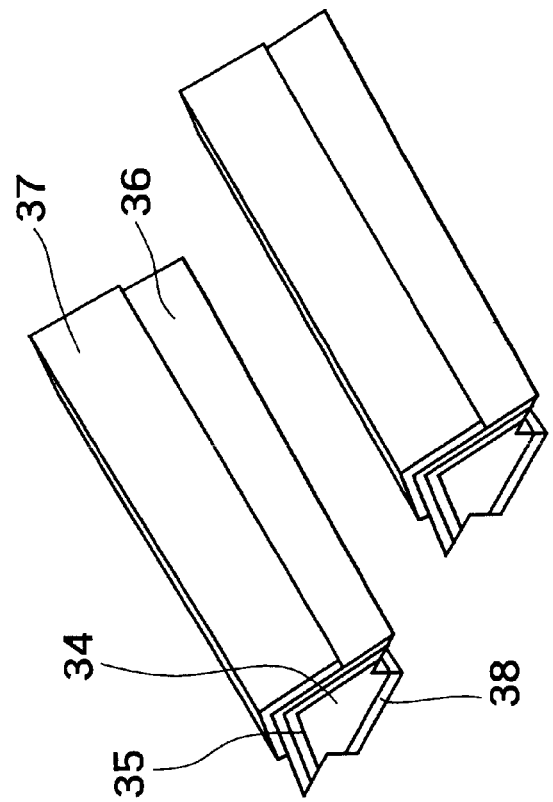
FIGS. 15A and 15B are a sectional view and a perspective view, respectively, showing the step of forming an n-side electrode in the method of fabricating a semiconductor device according to the second embodiment of the present invention.
Figure 15A:
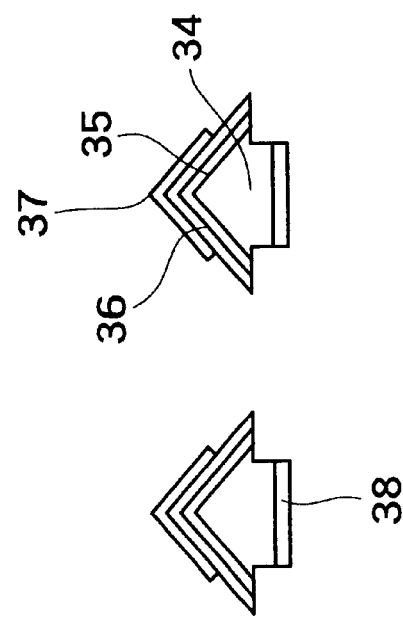

FIGS. 15A and 15B are a sectional view and a perspective view, respectively, showing the step of forming an n-side electrode in the fabrication method according to the second embodiment.

The back surface of each triangular prism shaped stacked structure containing a number of a semiconductor light emitting devices is etched with acid or the like, and an n-side electrode 38 typically having a Ti/Al/Pt/Au electrode structure is formed thereon by the vapor-deposition process or the like.

After being peeled from the growth substrate 31 and the under growth layer 32, each triangular prism shaped stacked structure having an approximately triangular cross-section, which is composed of the first conductive type layer 34, the active layer 35, and the second conductive type layer 36, is cut in the direction perpendicular to the ridge line of the stacked structure into a number of semiconductor light emitting devices by dicing or etching.

In this case, a cleavage plane functioning as a resonance end plane of a semiconductor laser can be formed by cleavage described below.

Figure 16A:
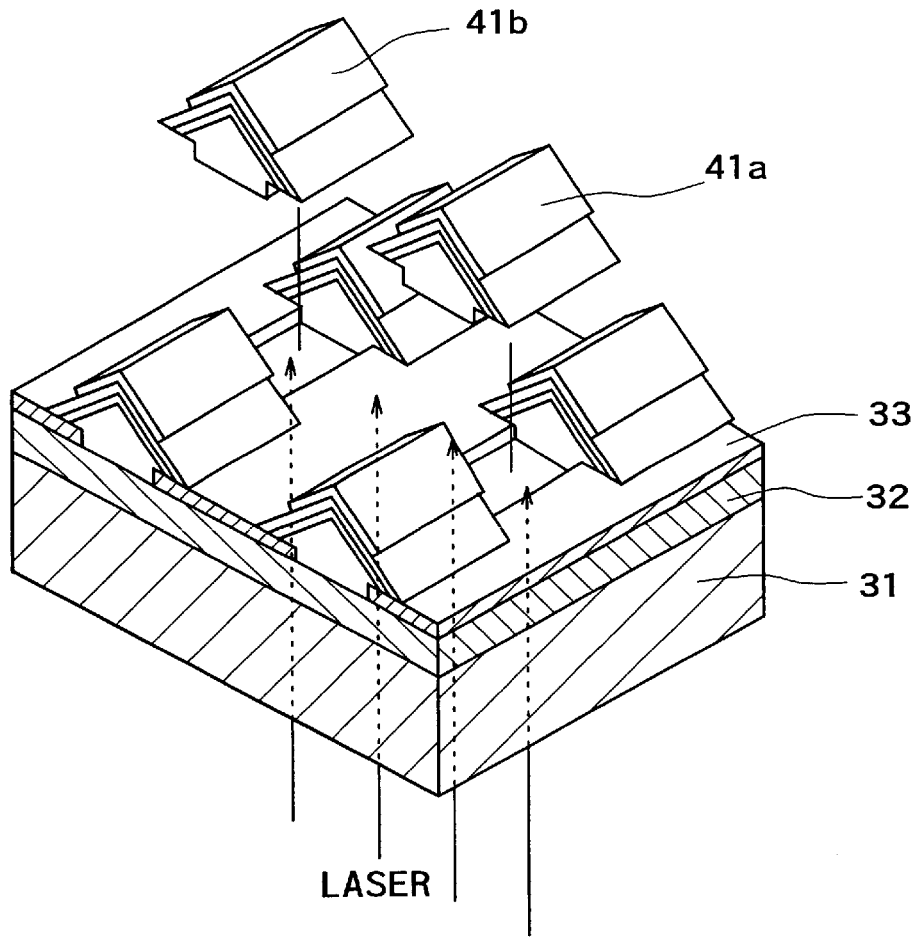
FIGS. 16A and 16B are a perspective view and a bottom view, respectively, showing the step of peeling part of a stacked structure, which is composed of the first conductive layer, the active layer, and the second conductive type layer formed by the fabrication method according to the second embodiment, from the growth substrate and the under growth layer.
Figure 16B:
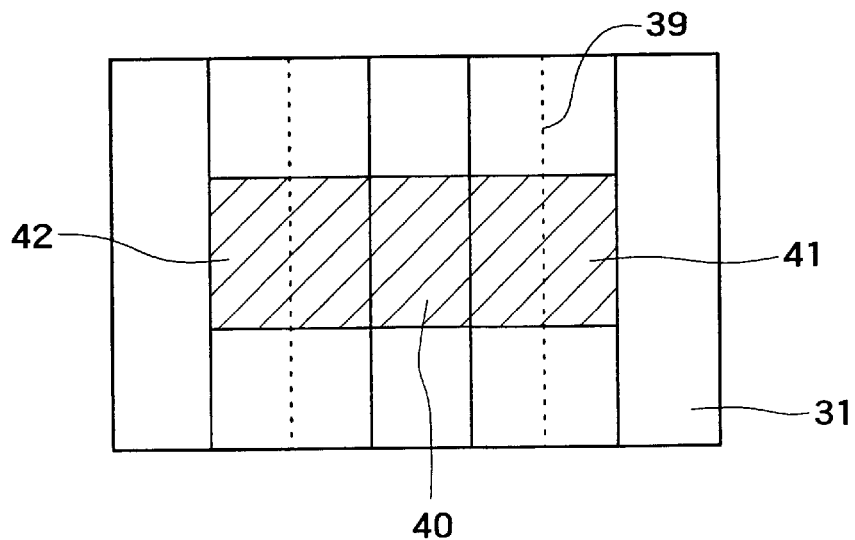

By making use of the above-described peeling and isolating method for a semiconductor light emitting device using laser irradiation, as shown in FIGS. 16A and 16B, it is possible to peel a desired semiconductor light emitting device of the triangular prism shaped stacked structure from the growth substrate 31 and the under growth layer 32 by irradiating the device portion with laser beams from the back side of the growth substrate 31 and simultaneously form a cleavage plane functioning as a resonance end plane of a semiconductor laser on an end plane of the device.

FIG. 16A is a perspective view showing the step of peeling the desired two devices contained in the two triangular prism shaped stacked structures adjacent to each other from the growth substrate 31 and the under growth layer 32, and FIG. 16B is a bottom view showing a laser beam irradiation region irradiated with laser beams to peel the desired two devices from the growth substrate 31 and the under growth layer 32.

As shown in FIG. 16B, a laser beam irradiation region 40 in which desired devices 41a and 41b are located is irradiated with laser beams traveling from the back side of the growth substrate 31. At this time, the devices 41a and 41b located in the laser beam irradiation region 40 are irradiated with the laser beams, and thereby peeled from the growth substrate 31 and the under growth layer 32 due to abrasion described above. On the other hand, device portions adjacent to each of the devices 41a and 41b, which are located out of the laser beam irradiation region 40, of the triangular prism shaped stacked structure are not irradiated with the laser beams and thereby are not peeled from the growth substrate 31 and the under growth layer 32. Accordingly, the interface plane between each of the devices 41a and 41b and the device adjacent thereto is cleaved in the direction perpendicular to a ridge line 39 of the triangular prism shaped stacked structure composed of the first conductive type layer 34, the active layer 35, and the second conductive type layer 36, to form a pair of cleavage planes functioning as resonance end planes of a semiconductor laser on the end planes of each of the devices 41a and 41b as shown in FIG. 16A.

In this way, by irradiating the desired devices 41a and 41b with laser beams, it is possible to efficiently peel the devices 41a and 41b from the growth substrate 31 and the under growth layer 32 and simultaneously form a pair of cleavage planes functioning as resonance end planes on the end planes of each of the devices 41a and 41b.

The method according to the second embodiment described above has the following advantages.

Since the band gap energy of the first conductive type layer 34 is smaller than that of the under growth layer 32, when the laser beams having an energy between the band gap energies of the layers 32 and 34 are emitted to the back side of the growth substrate 31, the laser beams are not absorbed by the under growth layer 32, but by the first conductive layer 34. Accordingly, the first conductive type layer 34 side interface between the under growth layer 32 and the first conductive type layer 34 absorbs the laser beams, whereby abrasion occurs at the first conductive type layer 34 side interface. As a result, the growth substrate 31 can be simply peeled, together with the under growth layer 32, from the triangular prism shaped stacked structure, and the n-side electrode 38 can be efficiently formed on the exposed back surface of the first conductive type layer 34 of the peeled hexagonal pyramid shaped stacked structure.

Each of the triangular prism shaped stacked structures, which is composed of the first conductive layer 34, the active layer 35, and the second conductive layer 36 formed by selective growth, is bonded to the growth substrate 31 via the under growth layer 32. However, these hexagonal pyramid shaped stacked structures are separated from each other. Accordingly, when peeled from the growth substrate 31 and the under growth layer 32, the triangular prism shaped stacked structures are simultaneously isolated from each other.

As a result, according to the second embodiment, a number of triangular prism shaped stacked structures, each containing a number of semiconductor light emitting devices, can be efficiently peeled from the growth substrate 31 and the under growth layer 32 and simultaneously isolated from each other.

Further, by selectively irradiating a desired device portion of the triangular prism shaped stacked structure composed of the first conductive type layer 34, the active layer 35, and the second conductive type layer 36, it is possible to peel the device from the growth substrate 31 and the under growth layer 32 and simultaneously form a pair of cleavage planes functioning as resonance end planes of a semiconductor laser on the end planes of the device.

Although the present invention has been described with reference to specific embodiments, those of skill in the art will recognize that changes may be made thereto without departing from the spirit and scope of the present invention as set forth in the hereafter appended claims.

What is claimed is:

1. A method of fabricating a semiconductor device, the method comprising the steps of:
   forming an under growth layer on a substrate;
   forming an anti-growth film having a specific opening portion on the under growth layer;
   forming a first conductive type layer by selective growth from the opening portion, the first conductive type layer having a band gap energy smaller than that of the under growth layer;
   stacking an active layer and a second conductive type layer on the first conductive type layer to form a stacked structure; and
   peeling the stacked structure from the substrate and the under growth layer at an interface between the under growth layer and the first conductive type layer by irradiating the stacked structure with light rays traveling through the substrate.

2. A method of fabricating a semiconductor device as claimed in claim 1, wherein each of the under growth layer, the first conductive type layer, the active layer and the second conductive type layer is a wurtzite type compound semiconductor layer.

3. A method of fabricating a semiconductor device as claimed in claim 2, wherein the wurtzite type compound semiconductor layer is a nitride based compound semiconductor layer.

4. A method of fabricating a semiconductor device as claimed in claim 1, wherein the under growth layer is made from AlGaN and the first conductive type layer is made from GaN.

5. A method of fabricating a semiconductor device as claimed in claim 1, wherein at least the active layer extends within a plane parallel to a tilt crystal plane tilted from a principal plane of the substrate.

6. A method of fabricating a semiconductor device as claimed in claim 1, wherein the substrate has light permeability.

7. A method of fabricating a semiconductor device as claimed in claim 1, wherein the stacked structure is irradiated with the light rays traveling from a back side of the substrate.

8. A method of fabricating a semiconductor device as claimed in claim 1, wherein the peeling of the stacked structure from the substrate and the under growth layer is made by abrasion caused by light irradiation.

9. A method of fabricating a semiconductor device as claimed in claim 1, wherein the light rays have an energy value between a band gap energy of the under growth layer and a band gap energy of the first conductive type layer.

10. A method of fabricating a semiconductor device as claimed in claim 1, wherein the light rays are laser beams.

11. A method of fabricating a semiconductor device as claimed in claim 10, wherein the laser beams have a wavelength ranging from 340 nm to 360 nm.

12. A method of fabricating a semiconductor device as claimed in claim 1, wherein one electrode is formed on a peeled back surface of the first conductive layer of the stacked structure to form a semiconductor device.

13. A method of fabricating a semiconductor device as claimed in claim 1, wherein a cleavage plane of the stacked structure for forming a semiconductor device is formed by peeling the stacked structure from the substrate and the under growth layer.

14. A method of fabricating a semiconductor device as claimed in claim 1, wherein the cleavage plane becomes a resonance end plane of the semiconductor device.

15. A semiconductor device, comprising:
an under growth layer formed on a substrate;
an anti-growth film, having a specific opening portion, formed on the under growth layer;
a first conductive type layer formed by selective growth from the opening portion, the first conductive type layer having a band gap energy smaller than that of the under growth layer; and
an active layer and a second conductive type layer stacked on the first conductive type layer to form a stacked structure;
wherein the stacked structure is peeled from the substrate and the under growth layer at an interface between the under growth layer and the first conductive type layer by irradiating the stacked structure with light rays traveling through the substrate.

16. A semiconductor device as claimed in claim 15, wherein each of the under growth layer, the first conductive type layer, the active layer and the second conductive type layer is a wurtzite type compound semiconductor layer.

17. A semiconductor device as claimed in claim 16, wherein the wurtzite type compound semiconductor layer is a nitride based compound semiconductor layer.

18. A semiconductor device as claimed in claim 15, wherein the under growth layer is made from AlGaN and the first conductive type layer is made from GaN.

19. A semiconductor device as claimed in claim 15, wherein at least the active layer extends within a plane parallel to a tilt crystal plane tilted from a principal plane of the substrate.

20. A semiconductor device as claimed in claim 15, wherein the substrate has light permeability.

21. A semiconductor device as claimed in claim 15, wherein the stacked structure is irradiated with the light rays traveling from a back side of the substrate.

22. A semiconductor device as claimed in claim 15, wherein the peeling of the stacked structure from the substrate and the under growth layer is made by abrasion caused by light irradiation.

23. A semiconductor device as claimed in claim 15, wherein the light rays have an energy value between a band gap energy of the under growth layer and a band gap energy of the first conductive type layer.

24. A semiconductor device as claimed in claim 15, wherein the light rays are laser beams.

25. A semiconductor device as claimed in claim 24, wherein the laser beams have a wavelength ranging from 340 nm to 360 nm.

26. A semiconductor device as claimed in claim 15, wherein one electrode is formed on a peeled back surface of the first conductive layer of the stacked structure to form a semiconductor device.

27. A semiconductor device as claimed in claim 15, wherein a cleavage plane of the stacked structure for forming a semiconductor device is formed by peeling the stacked structure from the substrate and the under growth layer.

28. A semiconductor device as claimed in claim 15, wherein the cleavage plane becomes a resonance end plane of the semiconductor device.

* * * * *